United States Patent
Mavretic

(10) Patent No.: US 9,584,090 B2
(45) Date of Patent: *Feb. 28, 2017

(54) RF IMPEDANCE MATCHING NETWORK

(71) Applicant: Reno Technologies, Inc., Wilmington, DE (US)

(72) Inventor: Anton Mavretic, Natick, MA (US)

(73) Assignee: Reno Technologies, Inc.

(*) Notice: Subject to any disclaimer, the term of this patent is extended or adjusted under 35 U.S.C. 154(b) by 0 days.

This patent is subject to a terminal disclaimer.

(21) Appl. No.: 15/061,068

(22) Filed: Mar. 4, 2016

(65) Prior Publication Data

US 2016/0248396 A1    Aug. 25, 2016

Related U.S. Application Data

(63) Continuation of application No. 14/734,053, filed on Jun. 9, 2015, now Pat. No. 9,306,533.

(Continued)

(51) Int. Cl.
| | |
|---|---|
| *H03H 7/40* | (2006.01) |
| *H03H 7/38* | (2006.01) |
| *G01R 27/26* | (2006.01) |
| *G01R 27/28* | (2006.01) |
| *H01L 21/3065* | (2006.01) |
| *H01L 21/311* | (2006.01) |
| *H01L 21/3213* | (2006.01) |
| *H01L 21/02* | (2006.01) |
| *H01L 21/285* | (2006.01) |

(Continued)

(52) U.S. Cl.
CPC ............ *H03H 7/38* (2013.01); *G01R 27/2605* (2013.01); *G01R 27/28* (2013.01); *H01J 37/32183* (2013.01); *H01L 21/02274* (2013.01); *H01L 21/28556* (2013.01); *H01L 21/3065* (2013.01); *H01L 21/31116* (2013.01); *H01L 21/31138* (2013.01); *H01L 21/32136* (2013.01); *H01L 21/67115* (2013.01); *H03H 7/40* (2013.01)

(58) Field of Classification Search
CPC .................................. H03H 7/38; H03H 7/40
USPC ......................................................... 333/17.3
See application file for complete search history.

(56) References Cited

U.S. PATENT DOCUMENTS

| | | |
|---|---|---|
| 3,828,281 A | 8/1974 | Chambers |
| 4,110,700 A | 8/1978 | Rosen et al. |

(Continued)

FOREIGN PATENT DOCUMENTS

| | | |
|---|---|---|
| EP | 0840349 | 5/1998 |
| EP | 0840350 | 5/1998 |
| WO | 2006096589 | 9/2006 |

*Primary Examiner* — Stephen E Jones
(74) *Attorney, Agent, or Firm* — The Belles Group, P.C.

(57) ABSTRACT

An RF impedance matching network includes a transformation circuit coupled to an RF input and configured to provide a transformed impedance that is less than a fixed source impedance; a first shunt circuit in parallel to the RF input, the first shunt circuit including a first shunt variable component providing a first variable capacitance or inductance; and a first virtual ground coupled to the first shunt variable component and a ground; and a second shunt circuit in parallel to the RF input and, the second shunt circuit including a second shunt variable component providing a second variable capacitance or inductance; and a second virtual ground coupled to the second shunt variable component and the ground.

19 Claims, 11 Drawing Sheets

Related U.S. Application Data

(60) Provisional application No. 62/118,552, filed on Feb. 20, 2015.

(51) Int. Cl.
*H01L 21/67* (2006.01)
*H01J 37/32* (2006.01)

(56) References Cited

U.S. PATENT DOCUMENTS

| | | | |
|---|---|---|---|
| 4,679,007 A | 7/1987 | Reese et al. | |
| 4,692,643 A | 9/1987 | Tokunaga et al. | |
| 4,751,408 A | 6/1988 | Rambert | |
| 4,929,855 A | 5/1990 | Ezzeddine | |
| 5,012,123 A | 4/1991 | Ayasli et al. | |
| 5,079,507 A | 1/1992 | Ishida et al. | |
| 5,654,679 A | 8/1997 | Mavretic et al. | |
| 5,815,047 A | 9/1998 | Sorensen et al. | |
| 5,849,136 A | 12/1998 | Mintz et al. | |
| 5,880,921 A | 3/1999 | Tham et al. | |
| 5,889,252 A | 3/1999 | Williams et al. | |
| 5,971,591 A | 10/1999 | Vona et al. | |
| 6,046,641 A | 4/2000 | Chawla et al. | |
| 6,137,367 A | 10/2000 | Ezzedine et al. | |
| 6,252,354 B1 | 6/2001 | Collins et al. | |
| 6,400,012 B1 | 6/2002 | Miller et al. | |
| 6,424,232 B1 | 7/2002 | Mavretic et al. | |
| 6,583,572 B2 | 6/2003 | Veltrop et al. | |
| 6,621,372 B2 | 9/2003 | Kondo et al. | |
| 6,657,395 B2 | 12/2003 | Windhorn | |
| 6,677,828 B1 | 1/2004 | Harnett et al. | |
| 6,703,080 B2 | 3/2004 | Reyzelman et al. | |
| 6,791,274 B1 | 9/2004 | Hauer et al. | |
| 6,794,951 B2 | 9/2004 | Finley | |
| 6,818,562 B2 | 11/2004 | Todorow et al. | |
| 6,888,313 B2 | 5/2005 | Blackburn et al. | |
| 6,888,396 B2 | 5/2005 | Hajimiri et al. | |
| 6,946,847 B2 | 9/2005 | Nishimori et al. | |
| 6,967,547 B2 | 11/2005 | Pellegrini et al. | |
| 7,004,107 B1 | 2/2006 | Raoux et al. | |
| RE39,051 E | 3/2006 | Harnett | |
| 7,071,786 B2 | 7/2006 | Inoue et al. | |
| 7,095,178 B2 | 8/2006 | Nakano et al. | |
| 7,113,761 B2 | 9/2006 | Bickham et al. | |
| 7,122,965 B2 | 10/2006 | Goodman | |
| 7,164,236 B2 | 1/2007 | Mitrovic et al. | |
| 7,199,678 B2 | 4/2007 | Matsuno | |
| 7,251,121 B2 | 7/2007 | Bhutta | |
| 7,298,091 B2 | 11/2007 | Pickard et al. | |
| 7,298,128 B2 | 11/2007 | Bhutta | |
| 7,304,438 B2 | 12/2007 | Kishinevsky | |
| 7,332,981 B2 | 2/2008 | Matsuno | |
| 7,439,610 B2 | 10/2008 | Weigand | |
| 7,480,571 B2 | 1/2009 | Howald et al. | |
| 7,495,524 B2 | 2/2009 | Omae et al. | |
| 7,498,908 B2 | 3/2009 | Gurov | |
| 7,514,935 B2 | 4/2009 | Pankratz | |
| 7,518,466 B2 | 4/2009 | Sorensen et al. | |
| 7,535,312 B2 | 5/2009 | McKinzie, III | |
| 7,602,127 B2 | 10/2009 | Coumou | |
| 7,642,879 B2 | 1/2010 | Matsuno | |
| 7,666,464 B2 | 2/2010 | Collins et al. | |
| 7,714,676 B2 | 5/2010 | McKinzie, III | |
| 7,728,602 B2 | 6/2010 | Valcore et al. | |
| 7,745,955 B2 | 6/2010 | Kirchmeier et al. | |
| 7,755,300 B2 | 7/2010 | Kishinevsky et al. | |
| 7,764,140 B2 | 7/2010 | Nagarkatti et al. | |
| 7,777,567 B2 | 8/2010 | Polizzo | |
| 7,852,170 B2 | 12/2010 | McKinzie, III | |
| 7,863,996 B2 | 1/2011 | Cotter et al. | |
| 7,868,556 B2 | 1/2011 | Xia | |
| 7,872,523 B2 | 1/2011 | Sivakumar et al. | |
| 7,917,104 B2 | 3/2011 | Manssen et al. | |
| 7,969,096 B2 | 6/2011 | Chen | |
| 8,008,982 B2 | 8/2011 | McKinzie, III | |
| 8,040,068 B2 | 10/2011 | Coumou et al. | |
| RE42,917 E | 11/2011 | Hauer et al. | |
| 8,089,026 B2 | 1/2012 | Sellers | |
| 8,102,954 B2 | 1/2012 | Coumou | |
| 8,110,991 B2 | 2/2012 | Coumou | |
| 8,203,859 B2 | 6/2012 | Omae et al. | |
| 8,217,731 B2 | 7/2012 | McKinzie, III | |
| 8,217,732 B2 | 7/2012 | McKinzie, III | |
| 8,228,112 B2 | 7/2012 | Reynolds | |
| 8,237,501 B2 | 8/2012 | Owen | |
| 8,264,154 B2 | 9/2012 | Banner et al. | |
| 8,278,909 B2 | 10/2012 | Fletcher | |
| 8,289,029 B2 | 10/2012 | Coumou | |
| 8,299,867 B2 | 10/2012 | McKinzie, III | |
| 8,314,561 B2 | 11/2012 | Fisk et al. | |
| 8,330,432 B2 | 12/2012 | Van Zyl et al. | |
| 8,334,657 B2 | 12/2012 | Xia | |
| 8,334,700 B2 | 12/2012 | Coumou et al. | |
| 8,335,479 B2 | 12/2012 | Koya et al. | |
| 8,344,559 B2 | 1/2013 | Van Zyl et al. | |
| 8,344,801 B2 | 1/2013 | Owen et al. | |
| 8,368,308 B2 | 2/2013 | Banna et al. | |
| 8,368,469 B2 | 2/2013 | Mohammadi et al. | |
| 8,395,322 B2 | 3/2013 | Coumou | |
| 8,416,008 B2 | 4/2013 | Van Zyl et al. | |
| 8,436,643 B2 | 5/2013 | Mason | |
| 8,461,842 B2 | 6/2013 | Thuringer et al. | |
| 8,466,736 B1 | 6/2013 | Reynolds | |
| 8,487,706 B2 | 7/2013 | Li et al. | |
| 8,502,689 B2 | 8/2013 | Chen et al. | |
| 8,513,889 B2 | 8/2013 | Zhang et al. | |
| 8,520,413 B2 | 8/2013 | Tran et al. | |
| 8,536,636 B2 | 9/2013 | Englekirk | |
| 8,552,665 B2 | 10/2013 | Larson et al. | |
| 8,558,633 B2 | 10/2013 | McKinzie, III | |
| 8,559,907 B2 | 10/2013 | Burgener et al. | |
| 8,564,381 B2 | 10/2013 | McKinzie | |
| 8,569,842 B2 | 10/2013 | Weis et al. | |
| 8,576,010 B2 | 11/2013 | Yanduru | |
| 8,576,013 B2 | 11/2013 | Coumou | |
| 8,587,321 B2 | 11/2013 | Chen et al. | |
| 8,620,236 B2 | 12/2013 | Manssen et al. | |
| 8,624,501 B2 | 1/2014 | Nagarkatti et al. | |
| 8,633,782 B2 | 1/2014 | Nagarkatti et al. | |
| 8,638,159 B2 | 1/2014 | Ranta et al. | |
| 8,649,754 B2 | 2/2014 | Burgener et al. | |
| 8,659,335 B2 | 2/2014 | Nagarkatti et al. | |
| 8,674,606 B2 | 3/2014 | Carter et al. | |
| 8,680,928 B2 | 3/2014 | Jeon et al. | |
| 8,686,796 B2 | 4/2014 | Presti | |
| 8,710,926 B2 | 4/2014 | Nagarkatti et al. | |
| 8,716,984 B2 | 5/2014 | Mueller et al. | |
| 8,723,423 B2 | 5/2014 | Hoffman et al. | |
| 8,742,669 B2 | 6/2014 | Carter et al. | |
| 8,773,019 B2 | 7/2014 | Coumou et al. | |
| 8,779,859 B2 | 7/2014 | Su et al. | |
| 8,781,415 B1 | 7/2014 | Coumou et al. | |
| 8,815,329 B2 | 8/2014 | Ilic et al. | |
| 8,847,561 B2 | 9/2014 | Karlick et al. | |
| 8,884,180 B2 | 11/2014 | Ilic | |
| 8,884,525 B2 | 11/2014 | Hoffman et al. | |
| 8,890,537 B2 | 11/2014 | Valcore, Jr. et al. | |
| 8,912,835 B2 | 12/2014 | Nagarkatti et al. | |
| 8,928,329 B2 | 1/2015 | Downing et al. | |
| 9,306,533 B1 * | 4/2016 | Mavretic | H03H 7/40 |
| 2002/0060914 A1 | 5/2002 | Porter et al. | |
| 2003/0007372 A1 | 1/2003 | Porter et al. | |
| 2003/0046013 A1 | 3/2003 | Gerrish | |
| 2006/0170367 A1 | 8/2006 | Bhutta | |
| 2006/0198077 A1 | 9/2006 | Bhutta | |
| 2006/0232471 A1 | 10/2006 | Coumou | |
| 2007/0075784 A1 | 4/2007 | Pettersson et al. | |
| 2007/0139122 A1 | 6/2007 | Nagarkatti et al. | |
| 2008/0179948 A1 | 7/2008 | Nagarkatti et al. | |
| 2008/0180179 A1 | 7/2008 | Polizzo | |
| 2008/0197854 A1 | 8/2008 | Valcore et al. | |
| 2009/0207537 A1 | 8/2009 | Coumou | |
| 2010/0001796 A1 | 1/2010 | Sivakumar et al. | |
| 2010/0073104 A1 | 3/2010 | Cotter et al. | |

(56) References Cited

U.S. PATENT DOCUMENTS

| | | |
|---|---|---|
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2011/0241781 A1 | 10/2011 | Owen et al. |
| 2011/0247696 A1 | 10/2011 | Zolock et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |

* cited by examiner

RF IMPEDANCE MATCHING NETWORK

CROSS REFERENCE TO RELATED APPLICATIONS

The present application is a continuation of U.S. patent application Ser. No. 14/734,053, filed Jun. 9, 2015 which claims the benefit of U.S. Provisional Patent Application Ser. No. 62/118,552, filed Feb. 20, 2015, the disclosures of which are incorporated herein by reference in their entirety.

FIELD OF THE INVENTION

The field of the present invention relates to systems and methods for providing an RF impedance matching network.

BACKGROUND OF THE INVENTION

Semiconductor devices can include microprocessors, memory chips, and other types of integrated circuits and devices. The semiconductor device fabrication process uses plasma processing at different stages of the process. Plasma processing involves energizing a gas mixture by imparting energy to the gas molecules by introducing RF (radio frequency) energy into the gas mixture. This gas mixture is typically contained in a vacuum chamber, referred to as a plasma chamber, and the RF energy is typically introduced into the plasma chamber through electrodes.

In a typical plasma process, the RF generator generates power at a radio frequency—which is broadly understood as being within the range of 3 kHz and 300 GHz—and this power is transmitted through RF cables and networks to the plasma chamber, in order to provide efficient transfer of power from the RF generator to the plasma chamber, an intermediary circuit is used to match the fixed impedance of the RF generator with the variable impedance of the plasma chamber. Such an intermediary circuit is commonly referred to as an RF impedance matching network or more simply as an RF matching network.

The purpose of the RF matching network is to enable the variable plasma impedance to a value that more closely matches the fixed impedance of the RF generator. In many cases, particularly in semiconductor fabrication processes, the system impedance of the RF generator is fixed at 50 Ohms, and RF power is transmitted through coaxial cables which also have a fixed impedance of 50 Ohms. Unlike the impedance of the RF generator and the coaxial cables, the impedance of the plasma, which is driven by the RF power, varies. In order to effectively transmit RF power from the RF generator and the coaxial cables to the plasma chamber, the impedance of the plasma chamber must be transformed to non-reactive 50 Ohms (i.e., 50+j0). Doing so will help maximize the amount of RF power transmitted into the plasma chamber.

The typical RF matching network includes variable capacitors and a control unit with a microprocessor and field-programmable gate array (FPGA) to control the capacitance values of the variable capacitors. The value and size of the variable capacitors within the RF matching network are determined by the power handling capability, frequency of operation, and impedance range of the plasma chamber. The predominant type of variable capacitor used in RF matching network applications is a Vacuum Variable Capacitor (VVC). The VVC is an electromechanical device prone to mechanical failures.

As semiconductor devices shrink in size and become more complex, the feature geometries become very small. As a result, the processing time for each individual step needed to fabricate these small features has likewise been reduced—typically in the range of 5~6 s. RF matching networks which use VVCs generally take in the range of 1~2 s to match the plasma chamber impedance to the RF generator impedance. During a significant amount of the matching process, which includes the microprocessor and FPGA determining the capacitances for the VVCs needed to create the match, controlling the VVCs to the achieve the determined capacitances, and then finally time for the RF matching network circuits to stabilize with the new capacitances, the fabrication process parameters are unstable, and these unstable process parameters must be accounted for as pan of the overall fabrication process. Because the matching process time is becoming a more and more significant part of the time for each fabrication process step, the period in which process parameters are unstable becomes more of a factor in the overall fabrication process.

While Electronically Variable Capacitor (EVC) technology is known (see U.S. Pat. No. 7,251,121, the disclosure of which is incorporated herein by reference in its entirety), it has yet to be developed into an industry-accepted replacement for VVCs. Because an EVC is purely an electronic device, an EVC is not a one-for-one replacement for a VVC in an RF matching network. Further, matching networks employing EVCs often have drawbacks, including difficulty handling the voltage stresses that occur in high-power applications. Thus, advancements are therefore needed to more fully take advantage of using EVCs and other variable electronic devices as part of an RF matching network.

SUMMARY OF THE INVENTION

The present invention is directed toward systems and methods for providing an impedance matching network. Such a matching network can be advantageously employed in semiconductor fabrication systems and processes.

In a first aspect of the present invention, an RF impedance matching network includes an RF input configured to couple to an RF source, the RF source having a fixed RF source impedance; an RF output configured to couple to a load, the load having a variable load impedance; a transformation circuit coupled to the RF input and configured to provide a transformed impedance that is less than the fixed source impedance; a first shunt circuit in parallel to the RF input, the first shunt circuit comprising a first shunt variable component providing, a first variable capacitance or inductance; and a first virtual ground coupled to the first shunt variable component and a ground; and a second shunt circuit in parallel to the RF input and, the second shunt circuit comprising a second shunt variable component providing a second variable capacitance or inductance; and a second virtual around coupled to the second shunt variable component and the ground.

In a second aspect of the present invention, a method of matching an impedance includes determining a variable load impedance of a load, with an impedance matching network coupled between the load and an RF source, wherein the RF source has a fixed RF source impedance, and the impedance matching network comprises an RF input configured to couple to an RF source; an RF output configured to couple to a load; a transformation circuit coupled to the RF input and configured to provide a transformed impedance that is less than the fixed source impedance; a first shunt circuit in parallel to the RF input, the first shunt circuit comprising a first shunt variable component providing a first variable capacitance or inductance; and a first virtual ground coupled to the first shunt variable component and a ground; and a second shunt circuit, in parallel to the RF input and, the second shunt circuit comprising a second shunt variable component providing a second variable capacitance or inductance; and a second virtual ground coupled to the second shunt variable component and the ground; determining a first shunt capacitance value for the first shunt variable capacitance component and a second shunt capacitance value for the second shunt variable capacitance component for creating an impedance match at an RF input of the impedance matching network; and generating a control signal to cause the first shunt variable capacitance component to provide the first shunt capacitance value, or to cause the second shunt variable capacitance component to provide the second shunt capacitance value.

In a third aspect of the invention, a method of manufacturing a semiconductor includes placing a substrate in a plasma chamber configured to deposit a material layer onto the substrate or etch a material layer from the substrate; and energizing plasma within the plasma chamber by coupling RF power from an RF source into the plasma chamber to perform a deposition or etching, and while energizing the plasma determining a variable load impedance of the plasma chamber, with an impedance matching network coupled between the load and the RF source, wherein the RF source has a fixed RF source impedance, and the impedance matching network comprises an RF input configured to couple to an RF source; an RF output configured to couple to a load; a transformation circuit coupled to the RF input and configured to provide a transformed impedance that is less than the fixed source impedance; a first shunt circuit in parallel to the RF input, the first shunt circuit comprising a first shunt variable component providing a first variable capacitance or inductance; and a first virtual around coupled to the first shunt variable component and a ground; and a second shunt circuit in parallel to the RF input and, the second shunt circuit comprising a second shunt variable component providing a second variable capacitance or inductance; and a second virtual ground coupled to the second shunt variable component and the ground; determining a first shunt capacitance value for the first shunt variable capacitance component and a second shunt capacitance value for the second shunt variable capacitance component for creating an impedance match at an RF input of the impedance matching network; and generating a control signal to cause the first shunt variable capacitance component to provide the first shunt capacitance value, or to cause the second shunt variable capacitance component to provide the second shunt capacitance value.

Accordingly, an improved matching network, along with systems and methods incorporating same, is disclosed. Advantages of the improvements will be apparent from the drawings and the description of the preferred embodiment.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures.

DETAILED DESCRIPTION OF THE INVENTION

Figure 1A:
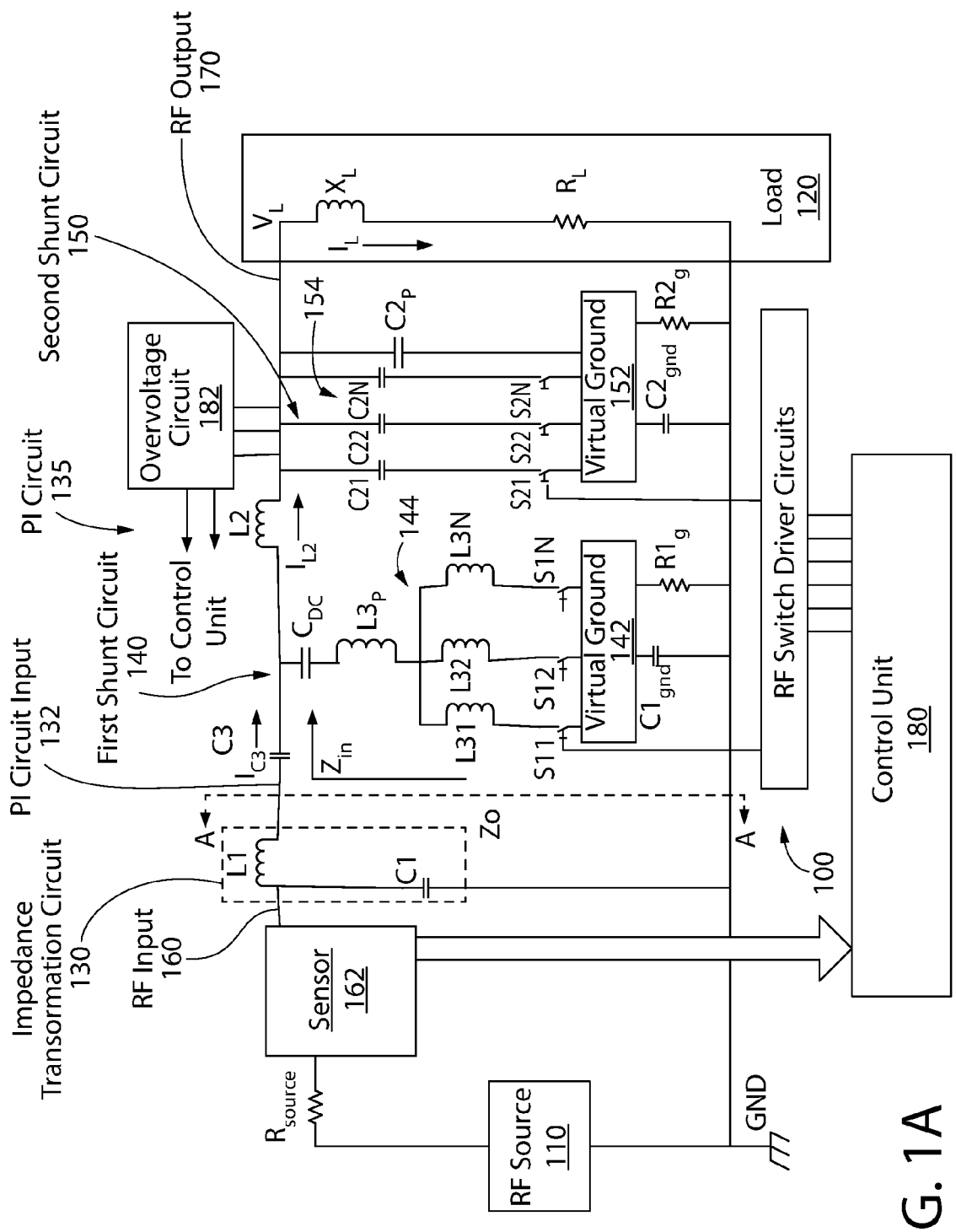
FIG. 1A is a schematic representation of a first embodiment of an RF impedance matching network.

The description of illustrative embodiments according to principles of the present invention is intended to be read in connection with the accompanying drawings, which are to be considered part of the entire written description. In the description of embodiments of the invention disclosed herein, where circuits are shown and described, one of skill in the art will recognize that for the sake of clarity, not all desirable or useful peripheral circuits and/or components are shown in the figures or described in the description. Moreover, the features and benefits of the invention are illustrated by reference to the disclosed embodiments. Accordingly, the invention expressly should not be limited to such disclosed embodiments illustrating some possible non-limiting combinations of features that may exist alone or in other combinations of features; the scope of the invention being defined by the claims appended hereto.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

In the embodiments of an RF impedance matching network disclosed herein, the matching network is configured as a "PI" type matching network. By this configuration, the switching of the variable capacitance components and variable inductance components (sometimes referred to collectively as variable components or reactive components) occurs in the shunt of the matching circuit. Thus, unlike in other matching networks, such as "L" type matching networks, the exemplified matching network switches its reactive components to a ground and not in series. There are no variable inductors or capacitors in the series leg.

In these embodiments, an RF impedance matching network includes an RF input configured to couple to an RF source, the RF source having a fixed RF source impedance; an RF output configured to couple to a load, the load having a variable load impedance; a transformation circuit coupled to the RF input and configured to provide a transformed impedance that is less than the fixed source impedance; and a PI circuit having a first shunt circuit in parallel to the RF input and a second shunt circuit in parallel to the RF input and the RF output. The first shunt circuit includes a first shunt variable component providing a first variable capacitance or inductance; and a first virtual ground coupled to the first shunt variable, component and a ground. The second shunt circuit includes a second shunt variable component providing a second variable capacitance or inductance; and a second virtual ground coupled to the second shunt variable component and the ground.

In general, the circuit configurations are tailored to either an inductive or capacitive load impedance of the chamber. Whether one configures a shunt circuit as an inductor or a capacitor will depend on factors such as frequency of operation, power, and the appropriate physical size of the element. For example, smaller inductors will be easier to package and layout, with lower heat dissipation that is easier to control. Specific embodiments will be described in more detail below.

Turning in detail to the drawings, FIG. 1A illustrates an RF impedance matching network 100 according to a first embodiment of the invention. The matching network 100 includes an RF input 160 configured to couple to an RF source 110, and an RF output 170 coupled to a load 120. A sensor 162 is coupled at the RF input 160 between the RF source 110 and the matching network 100. In the exemplified embodiment; the load 120 is a plasma chamber for semiconductor device fabrication. The semiconductor device can be microprocessor, a memory chip, or another type of integrated circuit or device. In other embodiments, the load 120 can be any load of variable impedance that can utilize an RF matching network.

In the exemplified embodiment, the RF impedance matching network 100 serves to help maximize the amount of RF power transferred from the RF source 110 to the plasma chamber 120 by matching the impedance at the RF input 160 to the fixed impedance of the RF source 110. The matching network 100 can consist of a single module within a single housing designed for electrical connection to the RF source 110 and plasma chamber 120. In other embodiments, the components of the matching network 100 can be located in different housings, some components can be outside of the housing, and/or some components can share a housing with a component outside the matching network 100.

As is known in the art, the plasma within a plasma chamber 120 typically undergoes certain fluctuations outside of operational control so that the impedance presented by the plasma chamber 120 is a variable impedance. Since the variable impedance of the plasma chamber 120 cannot be fully controlled, an impedance matching network may be used to create an impedance match between the plasma chamber 120 and the RF source 110.

Moreover, the impedance of the RF source 110 may be fixed at a set value by the design of the particular RF source 110. Although the fixed impedance of an RF source 110 may undergo minor fluctuations during use, due to, for example, temperature or other environmental variations, the impedance of the RF source 110 is still considered a fixed impedance for purposes of impedance matching because the fluctuations do not significantly vary the fixed impedance from the originally set impedance value. Other types of RF sources may be designed so that the impedance of the RF source may be set at the time of, or during, use. The impedance of such types of RF sources is still considered fixed because it may be controlled by a user (or at least controlled by a programmable controller) and the set value of the impedance may be known at any time during operation, thus making the set value effectively a fixed impedance.

The RF source 110 may be an RF generator of a type that is well-known in the art to generate an RF signal at an appropriate frequency and power for the process performed within the plasma chamber 120. The RF source 110 may be electrically connected to the RF input 160 of the RF impedance matching network 100 using a coaxial cable or similar means, which for impedance matching purposes would have the same fixed impedance as the RF source 110.

The plasma chamber 120 can include a first electrode and a second electrode, and in processes that are well known in the art, the first and second electrodes, in conjunction with appropriate control systems (not shown) and the plasma in the plasma chamber 120, enable one or both of deposition of materials onto a substrate and etching of materials from the substrate.

The sensor 162 is configured to monitor the RF signal output from the RF source 110. The sensor 162 can monitor an RF input parameter or multiple RF input parameters at the RF input 160. The sensor 162 can be any sensor configured to detect a parameter at the RF input 160. The input parameter can be any parameter measurable at the RF input 160 sufficient for operating the matching network 100, in the exemplified embodiment, the sensor 162 detects the voltage, current, and phase at the RF input 160 of the matching network 100. The sensor 162 can provide analog information to a control unit 180, where it is converted to a digital form. Based on the RF input parameter detected by the RF input sensor 162, the control unit 180 can determine the variable load impedance. The control unit 180 can further calculate the necessary switching positions on the shunt legs such that the proper inductance and capacitance is provided by the variable components 144, 154 for creating an impedance match. That is, the control unit 180 can determine a first shunt capacitance value for the first shunt variable capacitance component 144 and a second shunt capacitance value for the second shunt variable capacitance component 154 to create an impedance match at the RF input 160. The control unit 180 can then send a control the driver circuit 185 to alter a first shunt variable capacitance of the first shunt variable capacitance component 144; and alter a second shunt variable capacitance of the second shunt variable capacitance component 154 based on a second control signal received from the control unit 180. The match need not be a perfect matching of impedance. For example, an impedance match can result in 10% or less RF power reflected back to the RF source.

Most of the inductive and capacitive components used in the discussed embodiments can be designed on a ceramic substrate or some other material such as Rogers material that can withstand the temperature excursions. Particularly at higher power levels and large currents a capacitive array or/and inductive array may be specifically packaged to satisfy the thermal issues associated with current passing through the shunt elements and series elements at higher power levels. Many of these components will be either air cooled or water cooled, depending on the particular architecture used for a specific load.

Transformation Circuit

The matching network 100 of the exemplified embodiment includes both as PI circuit 135 and a transformation circuit 130. The fixed impedance transformation circuit 130 is located at the front-end of the matching network 100. The transformation circuit 130 is coupled to the RF input 160 and enables the impedance at cross-section A-A looking back toward RF input 160 to be lowered to a value that is less than the real part of the fixed RF source impedance, thus providing a desired lowered impedance at the input of the PI circuit 135 (the PI circuit input 132) that is less than the fixed impedance of the RF source 110. In this embodiment, the RF source impedance is fixed at 50 Ohms, and RF power is transmitted through coaxial cables which also have a fixed impedance of 50 Ohms, in other embodiments, the fixed impedance can be of a different value. In preferred embodiments, the lowered impedance is less than the real part of the load impedance ($R_L$).

The transformation circuit 130 includes an inductor L1 (sometimes referred to as a transformation inductor) and a capacitor C1 (sometimes referred to as a transformation capacitor). In this embodiment, the transformation inductor L1 is in series with the RF input 160, and the transformation capacitor C1 is in parallel to the RF input 160 and coupled to a chassis ground GND. In other embodiments, the configuration is reversed, with the capacitor in series with the RF input 160, and the inductor in parallel to the RF input 160 and coupled to the chassis ground GND. The configuration chosen depends on the remaining PI circuit 135 and the configuration that prevents the DC component of the load 120 returning to the RF source 110. The transformation circuit 130 is connected to a chassis ground GND (not the virtual grounds, which will be discussed below). In other embodiments, the chassis ground GND can be another type of ground.

In the exemplified embodiment, the transformation circuit 130 is configured to lower the impedance from 50 Ohms at the RF input 160 to approximately 15 Ohms at the PI circuit input 132 (the input of the PI circuit 135), with no imaginary part (or minimal imaginary part). Thus, for example, the output impedance ($Z_o$) of the transformation circuit 130 is approximately 15 Ohms+j0. The PI circuit 135 of the matching network 100 is designed for this reduced input impedance, referred to as $Z_{in}$ in FIGS. 1A-10. The interface between the output of the transformation circuit 130 and the PI circuit 135 is designated by line A-A.

The transformation circuit 130 can lower the voltage stresses on the matching network 100. Thus, high voltage stress on switches S11 to S1N and S21 to S2N will be lowered. Such lowered stress enhances the functioning of switches such as RF FET switches, PIN diodes, and insulated-gate bipolar transistors (IGBTs).

This lowered stress can be better understood by the following examples. In the first example, there is no transformation circuit. A 5,000 Watts RF generator (RF source) has a 50 Ohms output impedance ($R_{source}$) and a frequency of 27.12 MHz that is provided at the RF input 160 of the matching network 100. The matching network 100 is perfectly tuned to 50 Ohms at its input and has no reactive components present. The voltage ($V=\sqrt{PR}$) therefore will be $\sqrt{(5000W)(50Ohms)}$ or 500 V rms. The current ($I=V/R$) will be 500 V rms/50 Ohms, or 10 A rms.

In the second example, a transformation circuit lowers the impedance provided, at the input 132 of the PI circuit 135 to 15 Ohms. The voltage ($V=\sqrt{PR}$) will now be $\sqrt{(5000W)(15Ohms)}$ or 271.9 V rms, and the current ($I=V/R$) will be 273.9 V rms/15 Ohms, or 18.3 A rms. Thus, the current increases by a factor of 1.83, while the voltage decreases by a factor of 1.83. The active components of the PI circuit 135 more easily handle current than voltage. Thus, the transformation circuit's reduction of voltage causes less stress on the active components. A designer can choose for his convenience appropriate impedance reduction factor. That reduction factor depends on chamber load impedance and its real part ($Z_L=R_L+/-jX_L$). In preferred embodiments, the reduced input, impedance $Z_{in}$ is less than the real part of the load impedance ($R_L$).

PI Circuit

The PI circuit 135 of FIG. 1A includes a series capacitor C3 in series with the RF input 160 and coupled between the transformation inductor L1 and the RF output 170. The series capacitor C3 can decouple the DC component to help prevent the DC component of the load 120 from returning to the RF source 110. The PI circuit 135 further includes a series inductor L2 in series with the RF input 160 and coupled between the series capacitor C3 and the RF output 170. The PI circuit 135 further includes a first shunt circuit 140 in parallel to the RF input 160 and a second shunt circuit 150 parallel to the RF input 160.

The first shunt circuit 140 includes a first shunt capacitor $C_{DC}$ and a first shunt padding inductor $L3_P$. The first shunt capacitor $C_{DC}$ can decouple the DC component of the plasma coming back toward the switches S11, S12, S1N, such that the switches are not burdened with large components of the DC voltage. The first shunt circuit 140 further includes a first shunt variable inductive component 144 comprising (a) a plurality of first shunt inductors L31, L32, L32 coupled in parallel to the first shunt padding inductor $L3_P$, and (b) a plurality of first shunt switches S11, S12, S1N coupled to the plurality of first shunt inductors L31, L32, L32 and configured to connect and disconnect each of the plurality of first shunt inductors L31, L32, L32 to a first virtual around 142. Also included is a first shunt ground capacitor $C1_{gnd}$ coupled between the second virtual around and the ground GND. The first shunt ground capacitor $C1_{gnd}$ and a first shunt ground inductance inherent to the first virtual ground 142 can resonate in series to provide the lowest possible impedance from the virtual ground to the ground GND. The first shunt circuit 140 further includes a first shunt galvanic return resistor $R1_G$ coupled between the first virtual around 142 and the ground GND. The first shunt ground capacitor $C1_{gnd}$ and the first shunt galvanic return resistor $R1_G$ are coupled in parallel.

The second shunt circuit 150 includes a second shunt variable capacitance component 154 comprising (a) a plurality of second shunt capacitors C21, C22, C2N coupled in parallel, and (b) a plurality of second shunt switches S21, S22, S2N coupled to the plurality of second shunt capacitors C21, C22, C2N and configured to connect and disconnect each of the plurality of second shunt capacitors C21, C22, C2N to a second virtual ground 152. The circuit further includes a padding capacitor $C2_P$ coupled in parallel to at least one of the plurality of second shunt capacitors C21, C22, C2N, the padding capacitor $C2_P$ coupled to the second virtual ground 152. The circuit further includes a second shunt ground capacitor $C2_{gnd}$ coupled between the second virtual ground 152 and the ground GND, and a second shunt galvanic return resistor $R2_G$ coupled between the second virtual ground 152 and the ground GND. The second shunt ground capacitor $C2_{gnd}$ and the first shunt galvanic return resistor $R2_G$ are coupled in parallel. The capacitors, inductors, and resistors discussed herein can refer to any components of suitable design to provide capacitance, inductance, and resistance, respectively, in preferred embodiments, the matching network is designed such that, for a particular load, there is minimal possible variation of capacitors and inductors, thereby allowing the fewest possible switches. Padding capacitors and padding inductors are capacitors and inductors that do not need to be switched.

The variable inductance components discussed herein can refer to a plurality of shunt inductors and coupled switches, and is sometimes referred to as an inductive array or simply a variable inductor. Similarly, the variable capacitance components discussed herein can refer to a plurality of shunt capacitors and coupled switches, and is sometimes referred to as a capacitive array or simply as a variable capacitor. A variable inductance component can refer to any structure capable of providing a variable inductance, and a variable capacitance component can refer to any structure capable of providing a variable capacitance. For example, the variable capacitance component can be an electronic variable capacitor (EVC), as described in U.S. Pat. No. 7,251,121. By these components, the capacitances and inductances provided in the shunt legs can be controlled such that the combined impedances of the RF impedance matching network 100 and the plasma chamber match, or at least substantially match, the fixed impedance of the RF source 110. A first shunt variable inductance component 144 and a second shunt variable capacitance component 154 are shown in FIG. 1A.

Virtual Ground

Figure 1B:
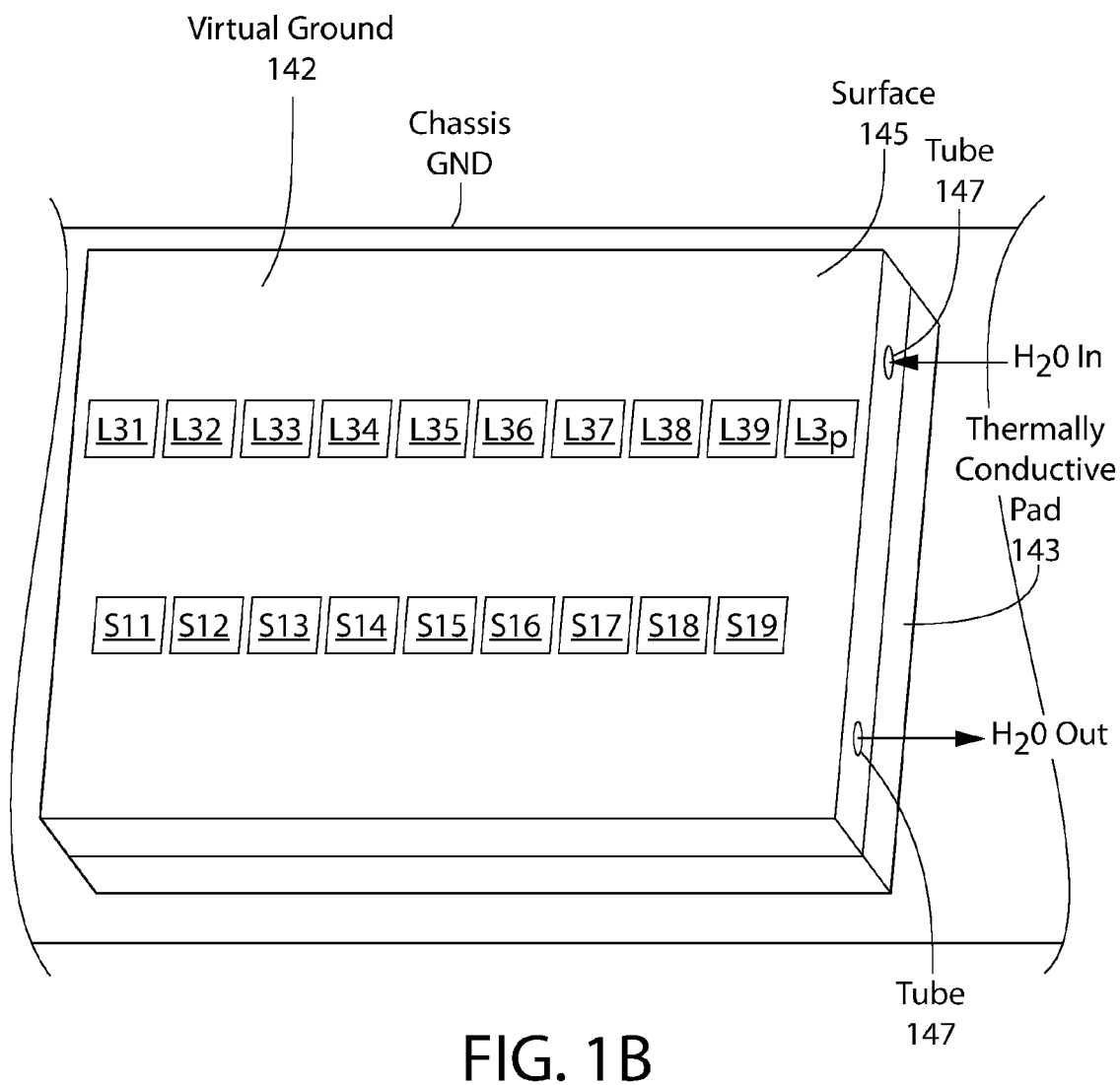
FIG. 1B is a representation of a first embodiment of a virtual ground.

As discussed above, the switches are not connected directly to chassis ground GND but to a virtual ground 142, 152. FIG. 1B shows an embodiment of the first virtual ground 142. The same or a similar structure can be used for virtual ground 152 and the other virtual grounds disclosed herein. In the exemplified embodiment of FIG. 1B, the virtual ground 142 is an aluminum plate with embedded tubes 147. The virtual ground 142 is water cooled, with water ($H_2O$) flowing in and out of the embedded tubes 147. The virtual ground can include thermally conductive isolation pads or paste between the virtual ground surface 145 and the chassis GND to conduct heat and to separate the virtual ground from the chassis ground GND. The pad 143 is not electrically conductive. In other embodiments, the virtual ground 142, 152 can be any electrically conductive component that is physically separated from a ground. For example, the virtual ground can be arranged vertically or include fins. Further, the virtual ground can include other cooling means. For example, at low power applications, the virtual ground can be air cooled. Standard heat sinking methods can be applied.

In the exemplified embodiment of FIG. 1B, nine switches S11-S19 are mounted on the surface 145 of the virtual around 142. The nine switches S11-S19 correspond with switches S11, S12, and S1N of FIG. 1A, since the "N" can refer to any total number of switches (or any total number of inductors or capacitors as "N" is used elsewhere in the drawings). In other embodiments, more or less switches can be used, depending on the required accuracy of the variable inductance (or variable capacitance in other embodiments).

Switchable and padding components L31-L39 and L3$_P$ (corresponding to L31, L32, L3N, L3$_P$ of FIG. 1A) can also be mounted on the surface 145 of the first virtual around 142, as shown in FIG. 1B. The exemplified embodiment uses nine switchable inductors, though, as with the switches discussed above, any number of switchable inductors (or switchable capacitors depending on the embodiment) can be used. Further, the other virtual grounds disclosed herein can be configured similarly. Thus, the switchable and padding components C21, C22, C2N, C2$_P$ of the second shunt circuit 150 can be mounted on a surface of the second virtual ground 152 in a manner similar to the surface 145 of virtual ground 142 shown in FIG. 1B. Further, similar virtual grounds can be used for the matching network embodiments shown in FIGS. 2-10. For example, virtual ground 242 of FIG. 2 can use a virtual ground configuration similar to that shown in FIG. 1B, but where capacitors C11, C12, C1N, C1$_P$ are mounted on the surface of the virtual ground 242 instead of inductors L31-L39 and L3$_P$.

As shown in FIG. 1A, the virtual ground 142, 152 can be connected to a common RF chassis ground GND via a ground capacitor C1$_{gnd}$, C2$_{gnd}$. The virtual ground 142, 152 has an inherent inductance ($L_{gnd}$) that is generally small. This inherent inductance can connect in series with the ground capacitor to create a series resonant circuit. The series resonant circuit acts as a short at the frequency of operation. There is also a galvanic return resistor designated as $R1_G$ or $R2_G$ that has a much larger value than the series resonance impedance of $L_{gnd}$ and $C_{gnd}$. Thus, the galvanic connection does not pass the main RF current.

By using a virtual ground for each shunt circuit of variable components, each branch return of RF-switched current can go to one point ground. Since the shunt branch RF current can be very large, they will be much easier to control and to stream them away from, for example, FET gate driving low voltage circuitry. Further, noise immunity and RF interference within the matching network will be much easier to control.

By the virtual ground, the switches in a shunt circuit can be connected to a platform from which heat can be better controlled and extracted if needed. The RF currents flowing from the tuning capacitors or inductors (e.g., L31, S21) will always flow into the virtual ground 142. The virtual ground 142 can also reduce the coupling capacitance from the back side of the switches and their respective FETs to a ground. Each variable capacitive or inductive component 144, 154 can have a separate virtual ground 142, 152 to further reduce the capacitive cross talk among the switches. The separation of switched currents in the virtual ground can help reduce the jitter noise in the switches as well as cross talk among the switches. These currents can be very difficult to control at very high RF power levels. The virtual ground can ease the design of high power switches.

After full layout of the circuit, one can determine the inductance of the ground connections. A capacitance can be determined for some very small impedance from virtual ground to the chassis ground GND by calculating the needed capacitance $C_{gnd}$. In a preferred embodiment, the capacitor $C_{gnd}$ has a very low ESR (equivalent series resistance) and should withstand several kilovolts of voltage breakdown in case of overvoltage occurrence on the RF switches. Choosing the proper components can prevent the network from being under high voltage stress. The embodiment shown in FIG. 1A is useful for an inductive load chamber and powers below 5 kW.

In the matching network 100 of FIG. 1A and certain other embodiments discussed hereafter, a bypass capacitor $C_{DC}$ (or C4) forms part of the shunt circuit 140 for the purpose of decoupling, the DC voltage that may be reflected from the chamber load 120. This capacitance is not part of the matching network 100 in that this capacitance is not used for matching purposes. The capacitor $C_{DC}$ can sustain high voltage swings coming back from the load 120 and can pass very large RF currents. For instance, at RF power P=5 kW, these currents may be in the order of 100 A rms. The bypass capacitor $C_{DC}$ can be in series with the variable shunt inductance and can prevent the DC voltage returning from the chamber 120 from reaching the RF switches.

In the exemplified embodiment, the switches use field effect transistors (FETS). in other embodiments, the switches use PIN/NIP diodes, a Micro Electro Mechanical (MEM) switch, a solid state relay, bipolar transistors, insulated-gate bipolar transistors (IGBTs), and the like. In the exemplified embodiment, each switch turns a capacitor or inductor ON or OFF to control the overall capacitance or inductance provided by the variable components 144, 154, thus enabling the matching network 100 to provide variable capacitance and variable inductance in the shunt legs. In alternative embodiments, a switch can be configured to control more than one capacitor or inductor.

The matching network 100 includes one or more RF switch driver circuits 185. The driver circuits 185 are configured to switch the plurality of switches S11, S12, S1N, S21, S22, S2N. Each of the driver circuits 185 can include several discrete driving circuits, with each discrete driving circuit configured to switch one of the switches.

The matching network 100 further includes a control unit 180. The control unit 180 is the brains of the RF impedance matching network 100 as it receives multiple inputs from sources such as the sensor 162 and the driver circuits 185 and makes calculations necessary to determine changes to the variable capacitance and inductance components 144, 154, and delivers commands to these components 144, 154 to create the impedance match. The control unit 180 can be of the type that is commonly used in semiconductor fabrication processes, and therefore known to those of skill in the art.

The control unit 180 can be configured with an appropriate processor and/or signal generating circuitry to provide an input signal for controlling the driver circuits 185. The control unit 180 of the matching network 100 can be a standard DSP- and FPGA-based architecture. The control unit 80 can house several other circuits, including an overvoltage conditioning circuit 182 for switching off all the active switches in the case of overvoltage at the output of the match. The overvoltage circuit 182 can indicate to the control board when to go into the shutdown condition.

In the exemplified embodiment, the control unit 180 includes a processor. The processor may be any type of properly programmed processing device, such as a computer or microprocessor, configured for executing computer program instructions (e.g. code). The processor may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network 100 to perform the functions described herein.

A power supply (not shown) can be connected to the driver circuits 185, control unit 180, and sensor 162 to provide operational power, at the designed currents and voltages, to each of these components.

The inductive and capacitive shunt designs in the PI configuration enable low voltage stresses on the variable components. High voltage stress is particularly hard on active FET switches that must switch large potentials as well as large currents at the power levels on the order of 5 kW. Since the disclosed embodiments do not switch any series components in these PI configurations, they are fixed in this matching network 100, and therefore there are lower voltages on the shunt capacitive or inductive components. This will be shown later in a tabular form.

At lower frequencies the inductors may be discrete since they will have inherently larger values. At higher frequencies such as 13.56 MHz, 27.12 MHz, 40.68 MHz, and 60 MHz, the inductors can be made by a method called spiral inductors and printed on a ceramic substrate.

Figure 2:
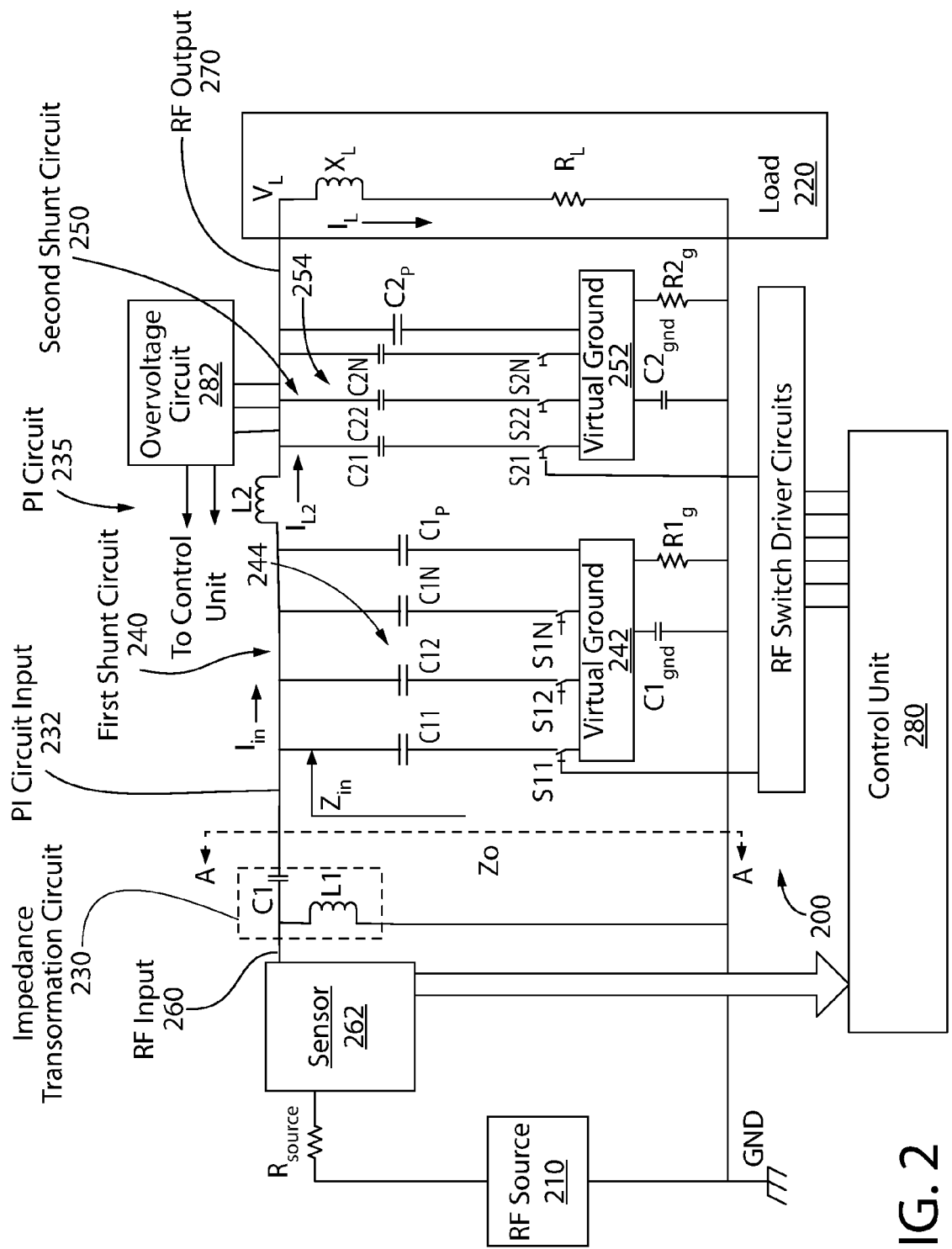
FIG. 2 is a schematic representation of a second embodiment of an RF impedance matching network.

FIG. 2 is a schematic representation of a second embodiment of an RF impedance matching, network 200. As will be described, this embodiment uses variable capacitance components 244, 254 in both shunt legs. As in FIG. 1A, the matching network 200 includes an RF input 260 configured to couple to an RF source 210 and an RF output 170 configured to couple to a load 220, a transformation circuit 230, and a PI circuit 235.

The transformation circuit 230 is again coupled to the RF input 260 and configured to provide a transformed impedance that is less than the fixed source impedance. The transformation capacitor C1, however, is in series with the RF input 260, and the transformation inductor L1 is in parallel to the RF input and coupled to the chassis ground GND.

The first shunt circuit 240 is in parallel to the RF input 260. The circuit 240 includes a first shunt variable capacitance component 244 comprising (a) a plurality of first shunt capacitors C11, C12, C1N coupled in parallel, and (b) a plurality of first shunt switches S11, S1, S13 coupled to the plurality of first shunt capacitors C11, C12, C1N and configured to connect and disconnect each of the plurality of first shunt capacitors C11, C12, C1N to a first virtual ground 242. The first shunt circuit 240 further includes a padding capacitor $C1_P$ ("first shunt padding capacitor") coupled in parallel to at least one of the plurality of first shunt capacitors C11, C12, C1N, the first shunt padding capacitor $C1_P$ coupled to the first virtual ground 242; a capacitor $C1_{gnd}$ ("first shunt around capacitor") coupled between the first virtual ground 242 and the ground GND; and a resistor $R1_G$ ("first shunt galvanic return resistor") coupled between the first virtual ground 242 and the ground GND.

The second shunt circuit 250 is also in parallel to the RF input 260. Similar to the first shunt circuit 240, the second shunt circuit 250 includes a second shunt variable capacitance component 254 comprising (a) a plurality of second shunt capacitors C21, C22, C2N coupled in parallel, and (b) a plurality of second shunt switches S21, S22, S2N coupled to the plurality of second shunt capacitors C21, C22, C2N and configured to connect and disconnect each of the plurality of second shunt capacitors C21, C22, C2N to a second virtual ground 252. The second shunt circuit 250 further includes a padding capacitor $C2_P$ ("second shunt padding capacitor") coupled in parallel to at least one of the plurality of second shunt capacitors C21, C22, C2N, the second shunt padding capacitor $C2_P$ coupled to the second virtual ground 252; a capacitor $C2_{gnd}$ ("second shunt ground capacitor") coupled between the second virtual ground 252 and the ground GND; and a resistor $R2_G$ ("second shunt galvanic return resistor") coupled between the second virtual ground 252 and the ground GND.

The matching network 200 further includes a series inductor L2 in series with the RF input 260 and coupled between the transformation capacitor C1 and the RF output 270. The embodiment of the matching network 200 shown in FIG. 2 is useful for inductive and capacitive loads. Since it has only one inductor in the series leg, it is efficient. It is useful for high power applications that are less than 10 kW.

Figure 3:
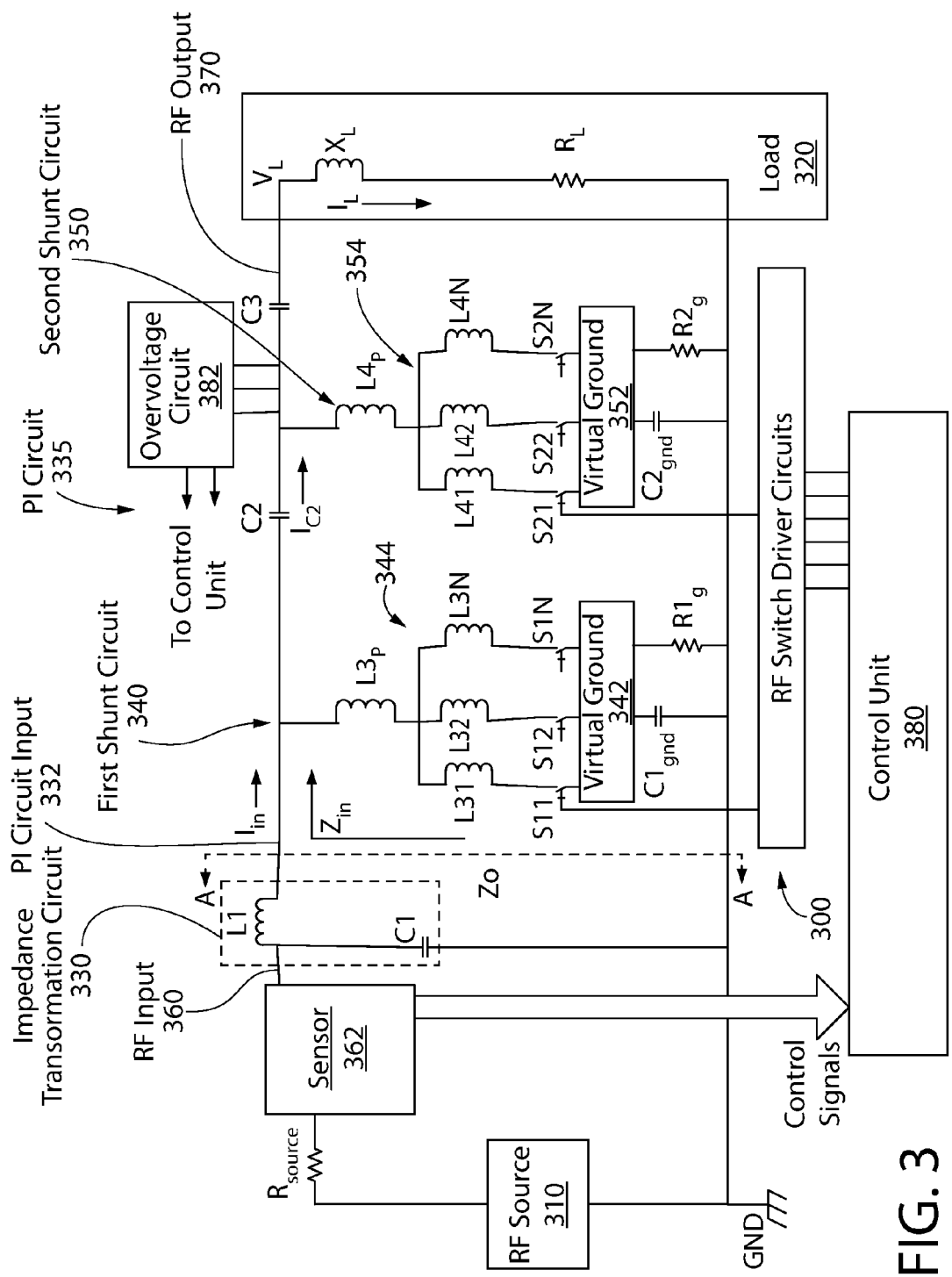
FIG. 3 is a schematic representation of a third embodiment of an RF impedance matching network.

FIG. 3 is a schematic representation of a third embodiment of an RF impedance matching network 300. In this embodiment, variable inductors 344, 354 are used in both shunt legs. As in the previous figures, the matching network 300 includes an RF input 360 configured to couple to an RF source 310 and an RF output 370 configured to couple to a load 320, a transformation circuit 330, and a PI circuit 335.

Similar to the embodiment shown in FIG. 1A, the transformation inductor L is in series with the RF input 360, and the transformation capacitor C1 is in parallel to the RF input 360 and coupled to a chassis ground GND. Also similar to FIG. 1A, the first shunt circuit 340 includes a first shunt padding, inductor $L3_P$; a plurality of first shunt inductors L31, L32, L3N coupled in parallel to the first shunt padding inductor L3$_P$; a plurality of first shunt switches S11, S12, S1N coupled to the plurality of first shunt inductors L31, L32, L3N and configured to connect and disconnect each of the plurality of first shunt inductors L31, L32, L3N to a first virtual ground 342; a first shunt ground capacitor C1$_{gnd}$ coupled between the second virtual ground 352 and the ground GND; and a first shunt galvanic return resistor R1$_G$ coupled between the first virtual ground 342 and the ground GND. The second shunt circuit 350 is configured similar to the first shunt circuit 340. The matching network 300 further includes a first series capacitor and a second series capacitor coupled in series between the RF input 360 and the RF output 370.

The embodiment of the matching network 300 shown in FIG. 3 has only one inductor in the series leg and therefore is more efficient. It is useful for high power applications up to more than 5 kW. It is useful for inductive loads.

Figure 4:
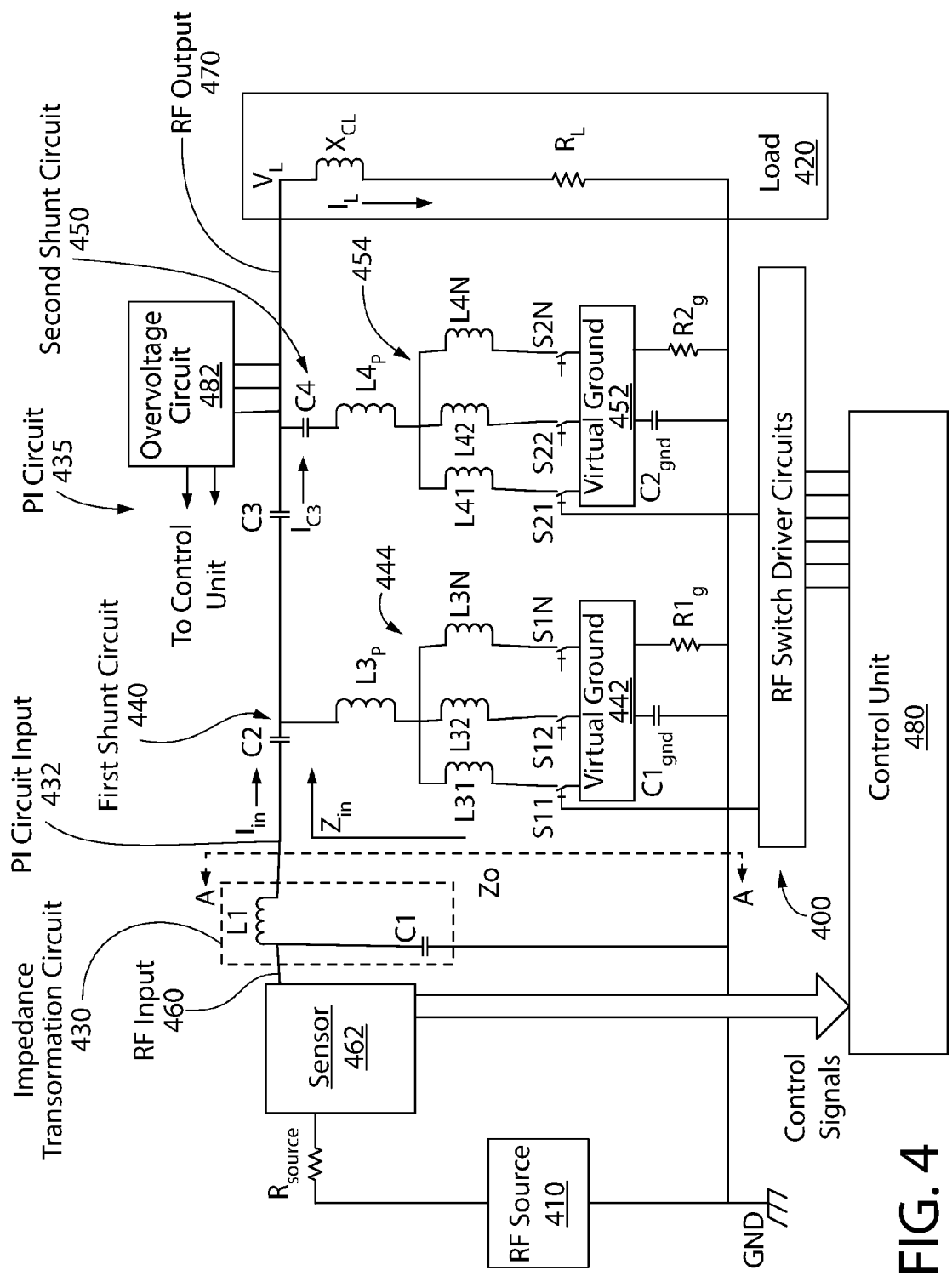
FIG. 4 is a schematic representation of a fourth embodiment of an RF impedance matching network.

FIG. 4 is a schematic representation of a fourth embodiment of an RF impedance matching, network 400. This embodiment is similar to the embodiment shown in FIG. 3, however, the first series capacitor C2 is coupled between the RF input 460 and the first shunt circuit 440, the second series capacitor C3 is coupled between the first shunt circuit 440 and the second shunt circuit 450, and a single capacitor C4 is coupled in series with the padding inductor L4$_P$ in the second shunt circuit 450. The embodiment of the matching network 400 shown in FIG. 4 has only one inductor in the series leg and therefore is useful in higher power matching designs, up to approximately 10 kW. The series capacitor C3 is moved away from high current in the load loop, which improves efficiency and therefore usefulness for high RF power matching.

Figure 5:
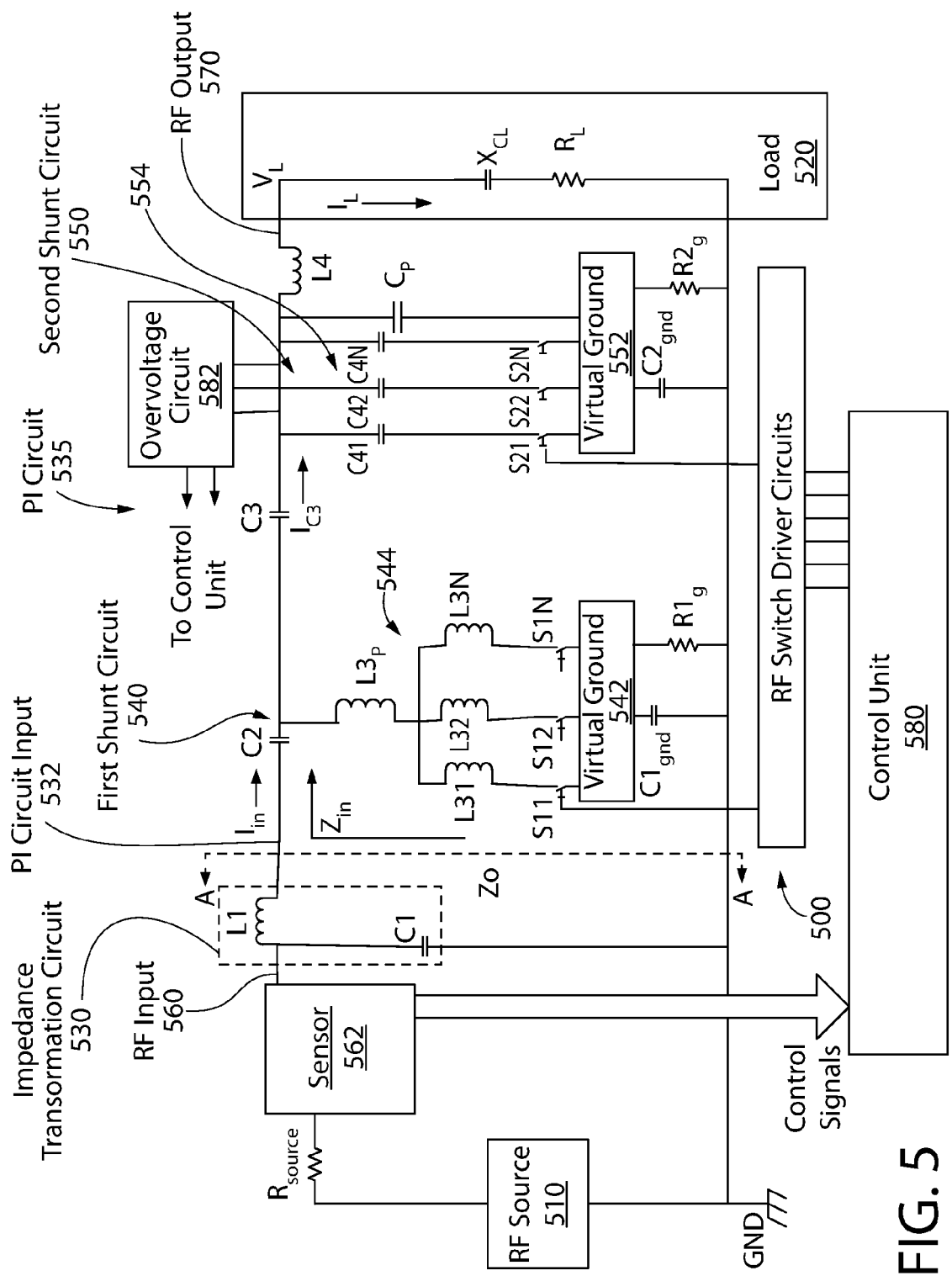
FIG. 5 is a schematic representation of a fifth embodiment of an RF impedance matching network.

FIG. 5 is a schematic representation of a fifth embodiment of an RF impedance matching network 500. This embodiment is similar to the embodiment shown in FIG. 1A, however, the series inductor 12 is replaced with a series capacitor C3, a series inductor L4 is added, and single capacitor C$_{DC}$ in the first shunt circuit 140 of FIG. 1A is eliminated. The embodiment of the matching network 500 shown in FIG. 5 is useful at lower powers up to 5 kW.

Figure 6:
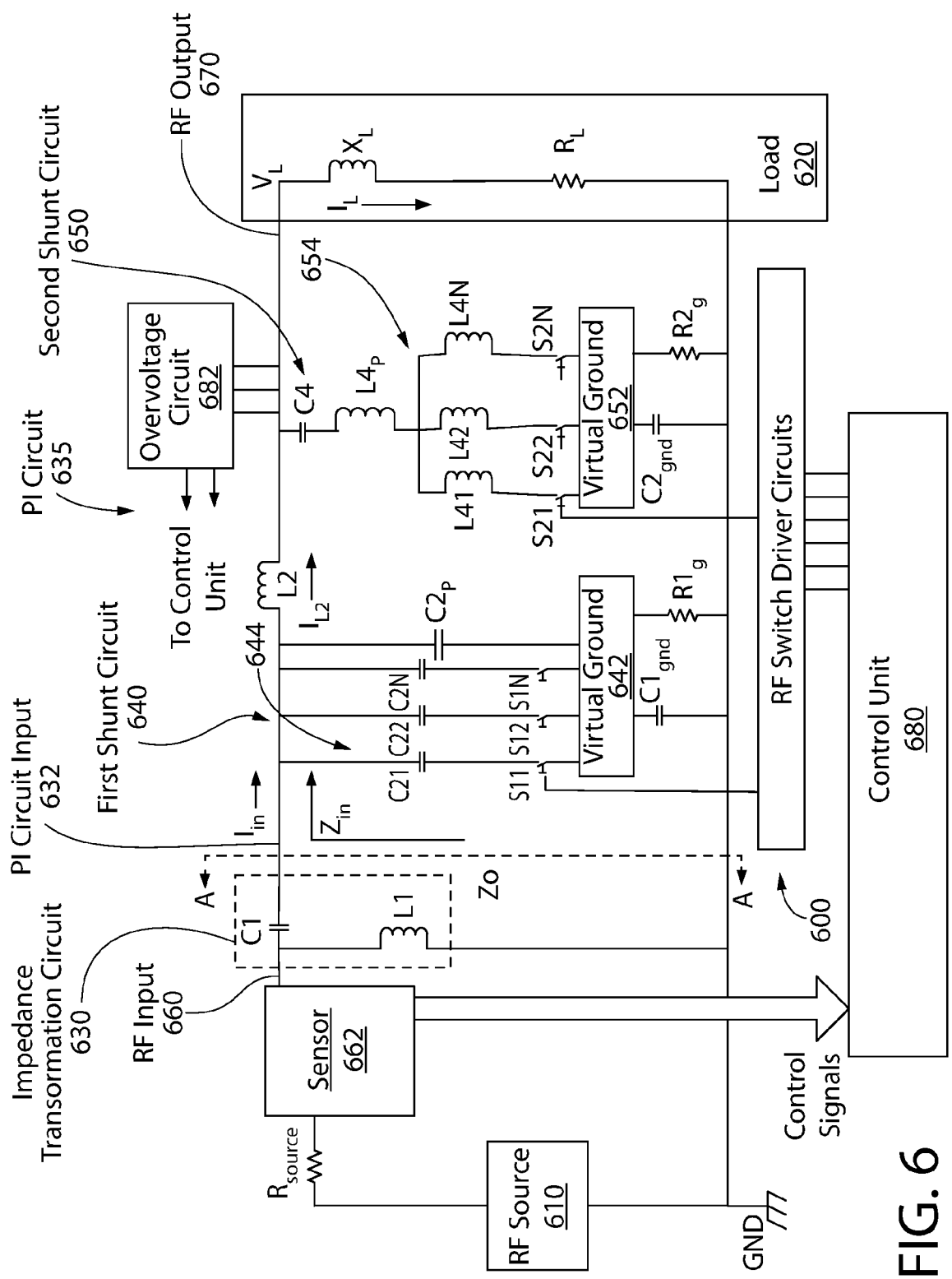
FIG. 6 is a schematic representation of a sixth embodiment of an RF impedance matching network.

FIG. 6 is a schematic representation of a sixth embodiment of an RF impedance matching network 600. This embodiment is similar to the embodiment shown in FIG. 1A, however, the inductor L1 and capacitor C1 of the transformation circuit 630 are reversed, the series capacitor C3 of FIG. 1A is eliminated, and the positioning of the first and second shunt circuit 650s is reversed, such that the first shunt circuit 640 has the plurality of switching capacitors C21, C22, C2N, and the second shunt circuit 650 has the plurality of switching inductors L41, L42, L4N. The embodiment of the matching network 600 shown in FIG. 6 is useful for medium-to-high powers and inductive loads. Since it has only one inductor in the series leg, it can provide good efficiency.

Figure 7:
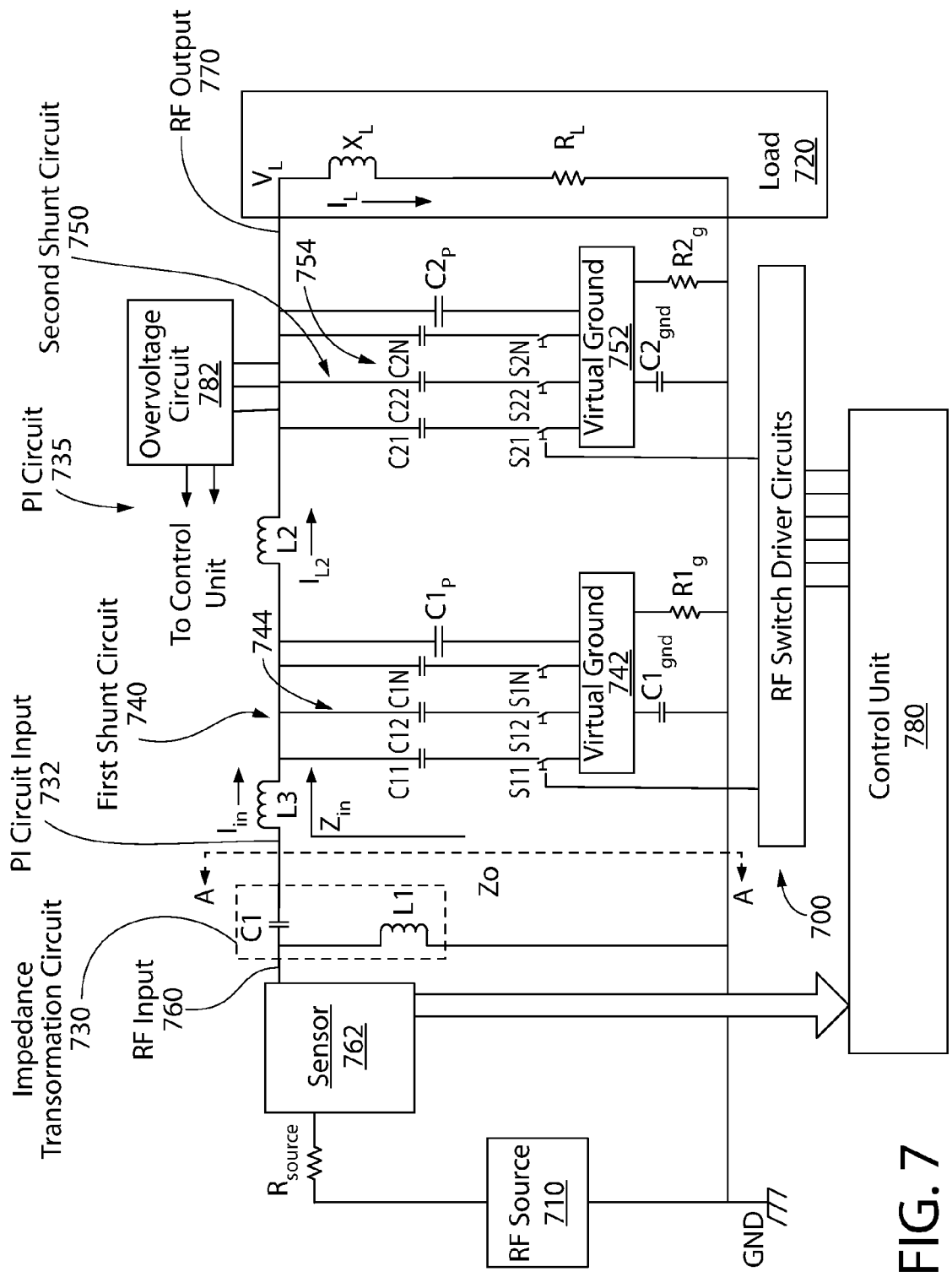
FIG. 7 is a schematic representation of a seventh embodiment of an RF impedance matching network.

FIG. 7 is a schematic representation of a seventh embodiment of an RF impedance matching network 700. This embodiment is similar to the embodiment shown in FIG. 2, however, a series inductor L3 is coupled between the transformation capacitor C1 and the first shunt circuit 740. The embodiment of the matching network 700 shown in FIG. 7 has two inductors in the series leg, and therefore is used for lower powers below 5 kW.

Figure 8:
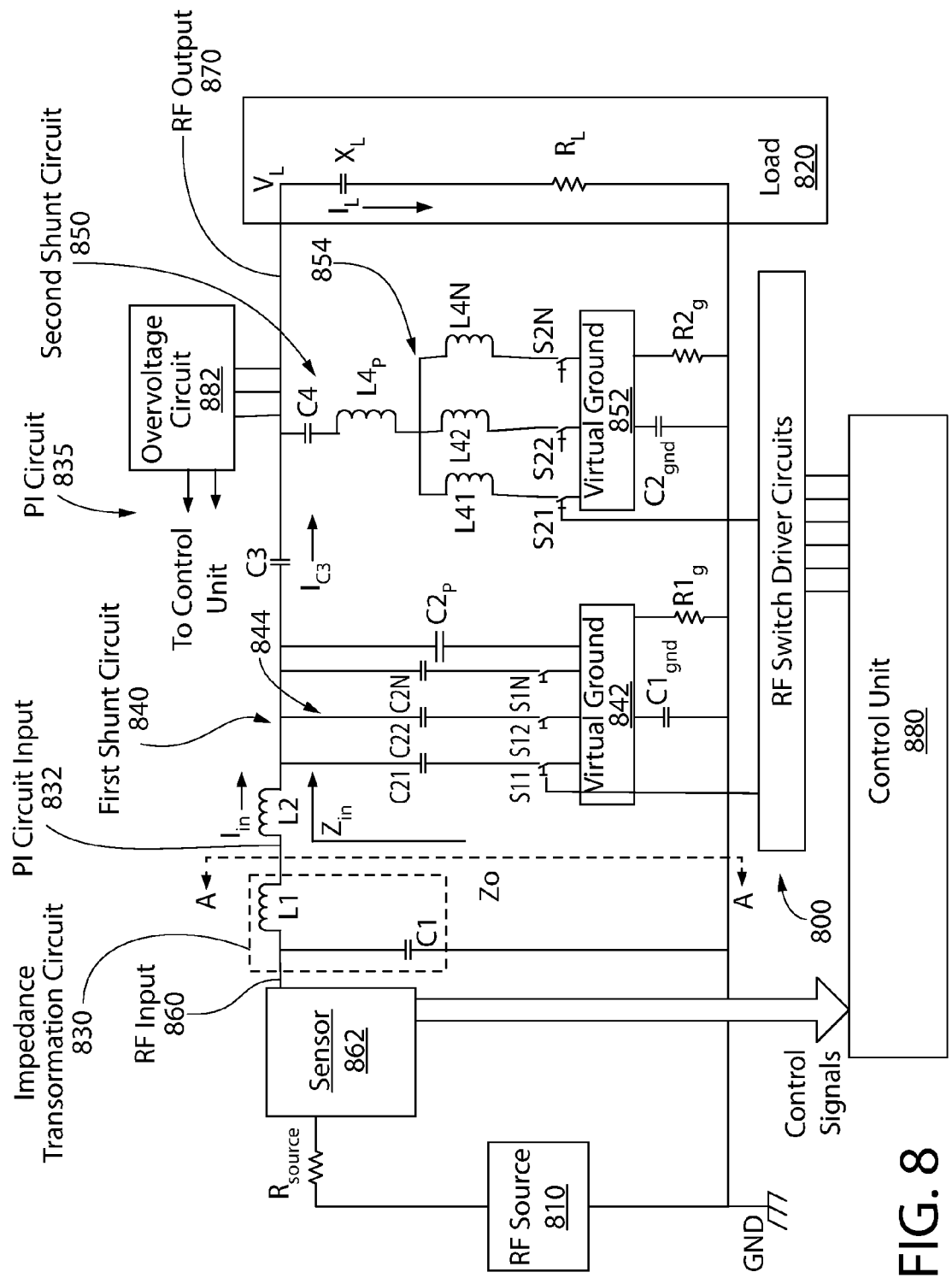
FIG. 8 is a schematic representation of an eighth embodiment of an RF impedance matching network.

FIG. 8 is a schematic representation of an eighth embodiment of an RF impedance matching network 800. This embodiment is similar to the embodiment shown in FIG. 6, however, the inductor L1 and capacitor C1 of the transformation circuit 830 are reversed, a series inductor L3 is added between the transformation inductor L1 and the first shunt circuit 840, and the series inductor L2 between the first and second shunt circuits 840, 850 is replaced with a series capacitor C3. The embodiment of the matching network 800 shown in FIG. 8 is useful for capacitive chamber loads. There are two inductors in the series leg and it is useful for applications below 5 kW.

Figure 9:
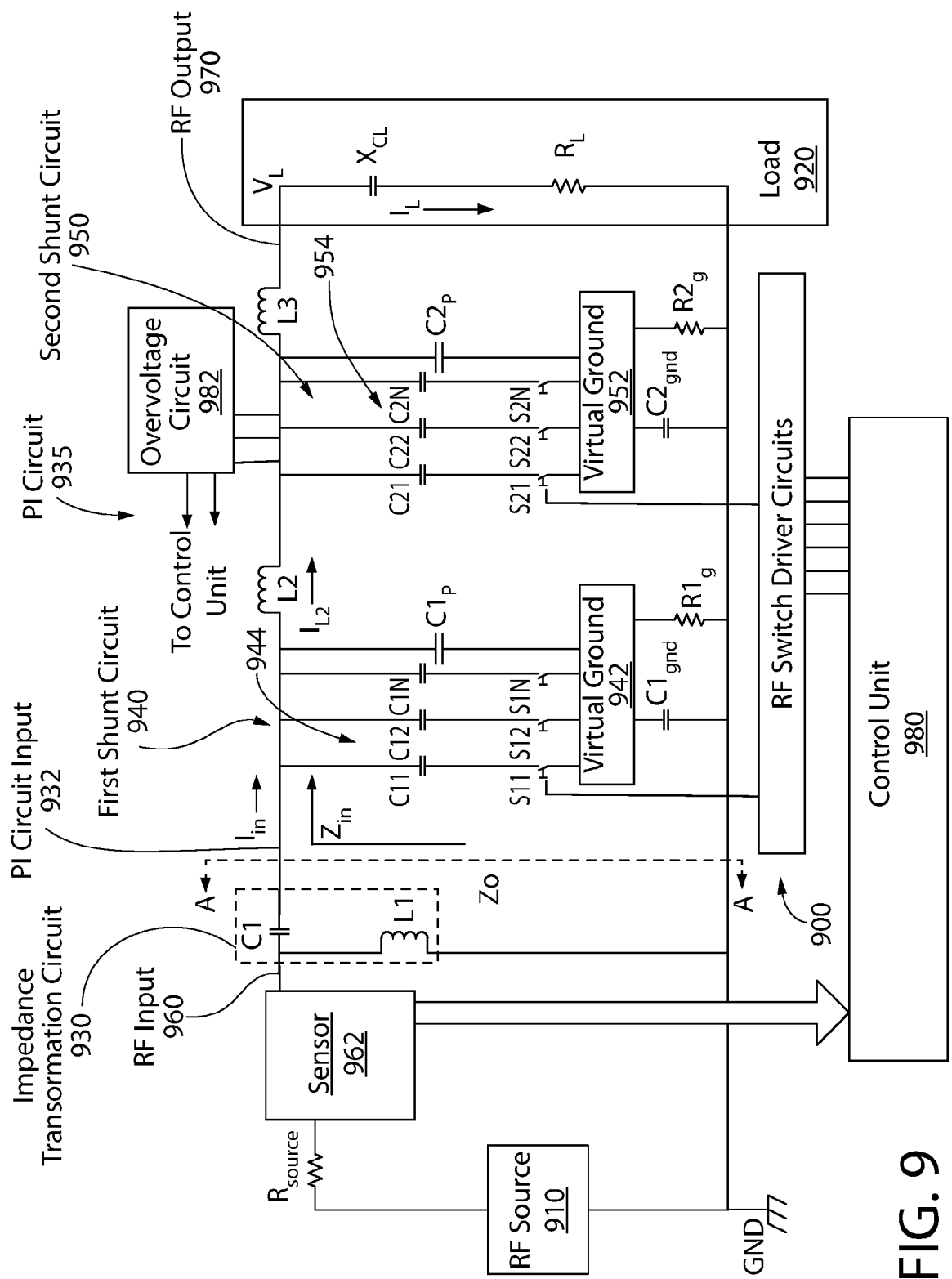
FIG. 9 is a schematic representation of a ninth embodiment of an RF impedance matching network.

FIG. 9 is a schematic representation of a ninth embodiment of an RF impedance matching network 900. This embodiment is similar to the embodiment shown in FIG. 2, however, an additional series inductor L3 is coupled between the second shunt circuit 950 and the RF output 970. The embodiment of the matching network 900 shown in FIG. 9 is useful for capacitive chamber loads. There are two inductors in the series leg and therefore more losses. It is useful for applications below 5 kW.

Figure 10:
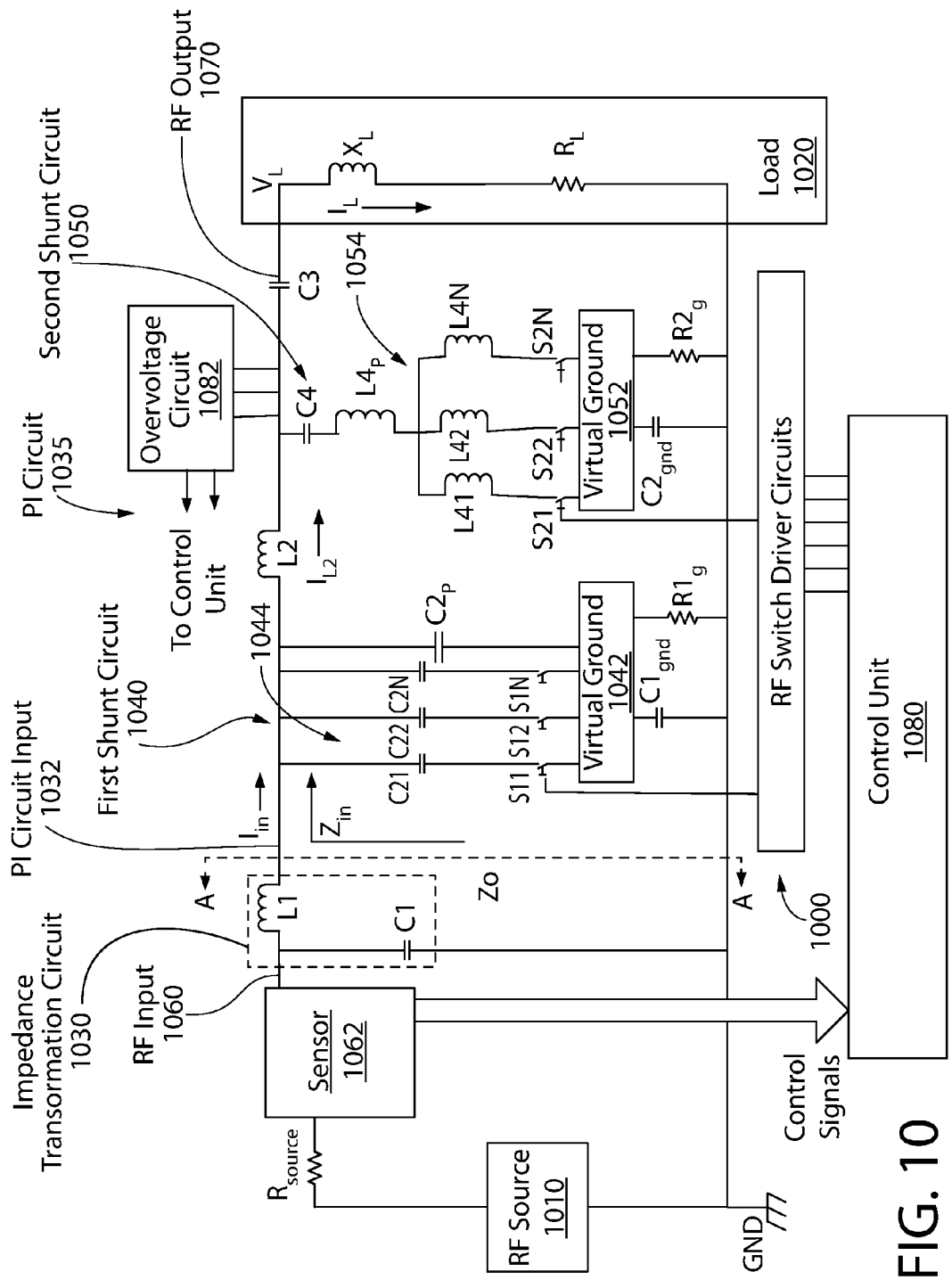
FIG. 10 is a schematic representation of a tenth embodiment of an RF impedance matching network.

FIG. 10 is a schematic representation of a tenth embodiment of an RF impedance matching network 1000. This embodiment is similar to the embodiment shown in FIG. 8, however, the series inductor L3 is coupled between the first shunt circuit 1040 and the second shunt circuit 1050, and the series capacitor C3 is coupled between the second shunt circuit 1050 and the RF output 1070. The embodiment of the matching network 1000 shown in FIG. 10 is useful for inductive chamber loads and for medium-to-low RF power applications. It is noted that, where components in one embodiment are similarly situated to components in another embodiment, the function and characteristics of those components can be similar, though a detailed discussion of those components is not repeated for that particular embodiment.

In Table 1, simulated results for typical matching conditions are shown for the matching network 100 shown in FIG. 1A. The impedance load conditions are assumed as typical chamber impedances. Values for series coupling capacitor C3 (2 nF) and series inductance L2 (8 uH) were specifically chosen to satisfy the circuit equations under the matching conditions. R$_L$ is representative of the real part of the load impedance. P$_{out}$ is the delivered RF power to the load resistor R$_L$. The example components were chosen for delivering 5 kW of RF power to a plasma chamber. The simulations show that the matching, network can satisfy all the load impedance conditions for a typical process.

TABLE 1

Matching Network of FIG. 1A Simulation Results.

| R$_L$ Ω | X$_L$ Ω | C3 nF | L31, L32, L3N (var.) uH | L2 (fixed) uH | C21, C22, C2N (var.) pF | I$_{C3}$ A, rms | I$_{L2}$ A, rms | I$_L$ A, rms | V$_L$ kV, rms | P$_{out}$ kW |
|---|---|---|---|---|---|---|---|---|---|---|
| 1 | 31 | 2 | 2.52 | 8 | 3,080 | 9.8 | 15.33 | 66.4 | 1.56 | 5 |
| 2 | 38 | 2 | 3.05 | 8 | 2,640 | 11.3 | 13.3 | 45 | 1.36 | 5 |
| 5 | 39 | 2 | 5 | 8 | 2,400 | 9.9 | 8.03 | 30.5 | 0.812 | 5.8 |
| 10 | 39 | 2 | 5 | 8 | 2,300 | 13.3 | 6.8 | 20 | 0.691 | 5.08 |

Software was used to determine the circuit components values for the variable shunt elements L3, C2 using the assigned load impedance values. The software then calculated the currents and voltages. As is shown, the matching network can be designed with reasonable values for the capacitors and inductors. The simulation was carried out at the frequency f=2 MHz, and therefore the components values reflect that frequency. The assumed power was 5 kW. One could choose other value for the variable shunt elements L3, C2 to attempt to have even smaller currents and voltages in the variable shunt elements L3, C2.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. An RF impedance matching network comprising:
   an RF input configured to couple to an RF source, the RF source having a fixed RF source impedance;
   an RF output configured to couple to a load, the load having a variable load impedance;
   a transformation circuit coupled to the RF input and configured to provide a transformed impedance that is less than the fixed source impedance;
   a first shunt circuit in parallel to the RF input, the first shunt circuit comprising:
      a first shunt variable component providing a first variable capacitance or inductance; and
      a first virtual ground coupled to the first shunt variable component and a ground; and
   a second shunt circuit in parallel to the RF input and, the second shunt circuit comprising:
      a second shunt variable component providing a second variable capacitance or inductance; and
      a second virtual ground coupled to the second shunt variable component and the ground.

2. The matching network of claim 1 wherein the transformation circuit comprises:
   a transformation capacitor in series with the RF input; and
   a transformation inductor in parallel to the RF input and coupled to a ground.

3. The matching network of claim 2 wherein the first shunt variable component is a first shunt variable capacitance component comprising (a) a plurality of first shunt capacitors coupled in parallel, and (b) a plurality of first shunt switches coupled to the plurality of first shunt capacitors and configured to connect and disconnect each of the plurality of first shunt capacitors to the first virtual ground.

4. The matching network of claim 3 wherein the second shunt variable component is a second shunt variable capacitance component comprising (a) a plurality of second shunt capacitors coupled in parallel, and (b) a plurality of second shunt switches coupled to the plurality of second shunt capacitors and configured to connect and disconnect each of the plurality of second shunt capacitors to the second virtual ground.

5. The matching network of claim 4 wherein the first shunt circuit further comprises:
   a first shunt padding capacitor coupled in parallel to at least one of the plurality of first shunt capacitors, the first shunt padding capacitor coupled to the first virtual ground;
   a first shunt ground capacitor coupled between the first virtual ground and the ground; and
   a first shunt resistor coupled between the first virtual ground and the ground.

6. The matching network of claim 5 wherein the second shunt circuit further comprises:
   a second shunt padding capacitor coupled in parallel to at least one of the plurality of second shunt capacitors, the second shunt padding capacitor coupled to the second virtual ground;
   a second shunt ground capacitor coupled between the second virtual ground and the ground; and
   a second shunt resistor coupled between the second virtual ground and the ground.

7. The matching network of claim 6 further comprising a series inductor in series with the RF input and coupled between the transformation capacitor and the RF output.

8. The matching network of claim 1 wherein the transformation circuit comprises:
   a transformation inductor in series with the RF input; and
   a transformation capacitor in parallel to the RF input and coupled to a ground.

9. The matching network of claim 8 wherein the first shunt variable component is a first shunt variable inductive component comprising (a) a plurality of first shunt inductors coupled in parallel to a first shunt padding inductor, and (b) a plurality of first shunt switches coupled to the plurality of first shunt inductors and configured to connect and disconnect each of the plurality of first shunt inductors to a first virtual ground.

10. The matching network of claim 9 wherein the second shunt variable component is a second shunt variable capacitance component comprising (a) a plurality of second shunt capacitors coupled in parallel, and (b) a plurality of second shunt switches coupled to the plurality of second shunt capacitors and configured to connect and disconnect each of the plurality of second shunt capacitors to a second virtual ground.

11. The matching network of claim 10 wherein the first shunt circuit further comprises:
   a first shunt ground capacitor coupled between the second virtual ground and the ground; and
   a first shunt resistor coupled between the first virtual ground and the ground.

12. The matching network of claim 11 wherein the second shunt circuit further comprises:
   a padding capacitor coupled in parallel to at least one of the plurality of second shunt capacitors, the padding capacitor coupled to the second virtual ground;
   a second shunt ground capacitor coupled between the second virtual ground and the ground; and
   a second shunt resistor coupled between the second virtual ground and the ground.

13. The impedance matching network of claim 1 wherein the at least one RF input parameter is a voltage, a current, and a phase at the RF input.

14. The impedance matching network of claim 13 further comprising a control unit configured to receive a signal from the sensor indicative of the at least one RF input parameter, the control unit further configured to determine the variable load impedance based on the RF input parameter.

15. The impedance matching network of claim 14 wherein the control unit is further configured to determine a first shunt capacitance value for the first shunt variable capacitance component and a second shunt capacitance value for the second shunt variable capacitance component to create an impedance match at the RF input.

16. The impedance matching network of claim 15 further comprising at least one driver circuit configured to:
- alter a first shunt variable capacitance of the first shunt variable capacitance component based on a first control signal received from the control unit; and
- alter a second shunt variable capacitance of the second shunt variable capacitance component based on a second control signal received from the control unit.

17. The RF impedance matching network of claim 16 wherein the impedance match results in 10% or less RF power reflected back to the RF source.

18. A method of matching an impedance, the method comprising:
- determining a variable load impedance of a load, with an impedance matching network coupled between the load and an RF source, wherein the RF source has a fixed RF source impedance, and the impedance matching network comprises:
  - an RF input configured to couple to an RF source;
  - an RF output configured to couple to a load;
  - a transformation circuit coupled to the RF input and configured to provide a transformed impedance that is less than the fixed source impedance;
  - a first shunt circuit in parallel to the RF input, the first shunt circuit comprising:
    - a first shunt variable component providing a first variable capacitance or inductance; and
    - a first virtual ground coupled to the first shunt variable component and a ground; and
  - a second shunt circuit in parallel to the RF input and, the second shunt circuit comprising:
    - a second shunt variable component providing a second variable capacitance or inductance; and
    - a second virtual ground coupled to the second shunt variable component and the ground;
- determining a first shunt capacitance value for the first shunt variable capacitance component and a second shunt capacitance value for the second shunt variable capacitance component for creating an impedance match at an RF input of the impedance matching network; and
- generating a control signal to cause the first shunt variable capacitance component to provide the first shunt capacitance value, or to cause the second shunt variable capacitance component to provide the second shunt capacitance value.

19. A method of manufacturing a semiconductor comprising:
- placing a substrate in a plasma chamber configured to deposit a material layer onto the substrate or etch a material layer from the substrate; and
- energizing plasma within the plasma chamber by coupling RF power from an RF source into the plasma chamber to perform a deposition or etching, and while energizing the plasma:
- determining a variable load impedance of the plasma chamber, with an impedance matching network coupled between the load and the RF source, wherein the RF source has a fixed RF source impedance, and the impedance matching network comprises:
  - an RF input configured to couple to an RF source;
  - an RF output configured to couple to a load;
  - a transformation circuit coupled to the RF input and configured to provide a transformed impedance that is less than the fixed source impedance;
  - a first shunt circuit in parallel to the RF input, the first shunt circuit comprising:
    - a first shunt variable component providing a first variable capacitance or inductance; and
    - a first virtual ground coupled to the first shunt variable component and a ground; and
  - a second shunt circuit in parallel to the RF input and, the second shunt circuit comprising:
    - a second shunt variable component providing a second variable capacitance or inductance; and
    - a second virtual ground coupled to the second shunt variable component and the ground;
- determining a first shunt capacitance value for the first shunt variable capacitance component and a second shunt capacitance value for the second shunt variable capacitance component for creating an impedance match at an RF input of the impedance matching network; and
- generating a control signal to cause the first shunt variable capacitance component to provide the first shunt capacitance value, or to cause the second shunt variable capacitance component to provide the second shunt capacitance value.

* * * * *